United States Patent
You et al.

(10) Patent No.: US 11,211,593 B2
(45) Date of Patent: Dec. 28, 2021

(54) DISPLAY APPARATUS, OLED DISPLAY PANEL AND METHOD OF MANUFACTURING THE SAME

(71) Applicant: BOE TECHNOLOGY GROUP CO., LTD., Beijing (CN)

(72) Inventors: Juanjuan You, Beijing (CN); Li Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 600 days.

(21) Appl. No.: 16/081,743

(22) PCT Filed: Jan. 24, 2018

(86) PCT No.: PCT/CN2018/073921
§ 371 (c)(1),
(2) Date: Aug. 31, 2018

(87) PCT Pub. No.: WO2018/233287
PCT Pub. Date: Dec. 27, 2018

(65) Prior Publication Data
US 2021/0126228 A1     Apr. 29, 2021

(30) Foreign Application Priority Data
Jun. 23, 2017   (CN) .......................... 201710485540.7

(51) Int. Cl.
H01L 51/56      (2006.01)
H01L 27/32      (2006.01)
H01L 51/52      (2006.01)

(52) U.S. Cl.
CPC .......... *H01L 51/56* (2013.01); *H01L 27/3246* (2013.01); *H01L 51/5209* (2013.01); *H01L 51/5225* (2013.01)

(58) Field of Classification Search
CPC . H01L 27/3246; H01L 51/56; H01L 51/5209; H01L 51/5225
See application file for complete search history.

(56) References Cited

U.S. PATENT DOCUMENTS 7,626,204 B2    12/2009   Jeong et al.
2005/0285100 A1 12/2005   Jeong et al.
(Continued)

FOREIGN PATENT DOCUMENTS

CN    103137893 A    6/2013
CN    103715221 A    4/2014
(Continued)

OTHER PUBLICATIONS

Chinese Office Action dated Apr. 24, 2019, from application No. 201710485540.7.
(Continued)

*Primary Examiner* — Christine A Enad
(74) *Attorney, Agent, or Firm* — Arch & Lake LLP

(57) ABSTRACT

The present disclosure relates to the field of display technologies, and in particular, to an OLED display panel, a method of fabricating the same, and a display apparatus. The OLED display panel includes; a base substrate, a plurality of first electrodes located on the base substrate. The OLED display panel include a pixel defining frame, located on the base substrate and separating a plurality of the first electrodes. The pixel defining frame is configured to define a plurality of sub-pixel regions. The OLED display panel includes an organic functional layer located on each of the sub-pixel regions and the pixel defining frame. The organic functional layer has a hollow structure at a position corresponding to the pixel defining frame, and the hollow structure forms an insulation between two adjacent sub-pixel regions in the organic functional later. The OLED display (Continued)

panel includes a second electrode, located on the organic functional layer.

3 Claims, 3 Drawing Sheets

(56) References Cited

U.S. PATENT DOCUMENTS

| | | | |
|---|---|---|---|
| 2015/0069361 A1* | 3/2015 | Sato | H01L 27/3279 |
| | | | 257/40 |
| 2016/0268354 A1 | 9/2016 | Xiong et al. | |
| 2017/0250236 A1* | 8/2017 | Xiong | H01L 51/001 |
| 2017/0365812 A1* | 12/2017 | Choung | H01L 27/3276 |

FOREIGN PATENT DOCUMENTS

| | | |
|---|---|---|
| CN | 104659070 A | 5/2015 |
| CN | 105552107 A | 5/2016 |
| CN | 105895664 A | 8/2016 |
| CN | 105895664 A | 8/2016 |
| CN | 107240599 A | 10/2017 |

OTHER PUBLICATIONS

International Search Report and Written Opinion dated Apr. 3, 2018, from application No. PCT/CN2018/073921.
Decision of Rejection issued to Chinese Application No. 201710485540.7 dated Jun. 29, 2020 with English translation, (15p).
Chinese Office Action dated Feb. 21, 2020, from application No. 201710485540.7.

\* cited by examiner

DISPLAY APPARATUS, OLED DISPLAY PANEL AND METHOD OF MANUFACTURING THE SAME

CROSS REFERENCE

The present disclosure is based upon International Application No. PCT/CN2018/073921, filed on Jan. 24, 2018, which is based upon and claims the priority of the patent application NO. CN201710485540.7, dated Jun. 23, 2017, and the titled "DISPLAY APPARATUS, OLED DISPLAY PANEL, AND METHOD OF MANUFACTURING THE SAME".

TECHNICAL FIELD

The present disclosure relates to the field of display technologies, and in particular, to an OLED display panel, a method of manufacturing the same, and a display apparatus.

BACKGROUND

The OLED (Organic Light Emitting Diode) as a current-type light emitting device, is widely used in high-performance display field due to advantages of self-luminous, fast response, wide viewing angle, and being able to be manufactured in a flexible substrate. According to driving manners, the OLED can be classified into a PMOLED (Passive Matrix Driving OLED) and an AMOLED (Active Matrix Driving OLED). The AMOLED display has advantages of low manufacturing cost, high response speed, power saving, applicable to DC driving of portable devices, and a wide operating temperature range, and is expected to become a next-generation flat panel display replacing the LCD (Liquid Crystal Display).

As the user's requirements for display quality continue to increase, the resolution of the OLED display panel is also getting higher and higher.

It should be noted that the information disclosed in the foregoing background section is only for enhancement of understanding of the background of the present disclosure and therefore may include information that does not constitute related art that is already known to those of ordinary skill in the art.

SUMMARY

According to one aspect, the present disclosure provides an OLED display panel, including a base substrate, a plurality of first electrodes, located on the base substrate. The OLED display panel includes a pixel defining frame, located on the base substrate and separating a plurality of the first electrodes. The pixel defining frame is configured to define a plurality of sub-pixel regions. The OLED display panel includes an organic functional layer, located on each of the sub-pixel regions and the pixel defining frame, and a second electrode, located on the organic functional layer. The organic functional layer has a hollow structure at a position corresponding to the pixel defining frame, and the hollow structure forms an insulation between two adjacent sub-pixel regions in the organic functional layer.

In an exemplary arrangement of the present disclosure, the hollow structure surrounds the sub-pixel region.

In an exemplary arrangement of the present disclosure, the hollow structure includes a first groove-shaped structure extending along a first direction and a second groove-shaped structure extending along a second direction.

In an exemplary arrangement of the present disclosure, the hollow structure includes a plurality of the first groove-shaped structures and a plurality of the second groove-shaped structures, and at least one column of sub-pixels is interposed between adjacent ones of the second groove-shaped structures. At least one row of sub-pixels is interposed between adjacent ones of the first groove-shaped structures, In an exemplary arrangement of the present disclosure, the organic functional layer includes a plurality of laminated layers including a light emitting layer and at least one of a hole injection layer, a hole transport layer, an electron transport layer, and an electron injection layer; the hole injection layer is disposed adjacent to the first electrode, and the electron injection layer is disposed adjacent to the second electrode.

In an exemplary arrangement of the present disclosure, the hollow structure penetrates at least one layer of the organic functional layer.

In an exemplary arrangement of the present disclosure, the first electrode is an anode layer and the second electrode is a cathode layer.

In an exemplary arrangement of the present disclosure, the base substrate is a rigid substrate or a flexible substrate.

According to one aspect, the present disclosure provides a method of manufacturing an OLED display panel, including: forming a plurality of first electrodes on a base substrate. The method includes forming, on the base substrate, a pixel defining frame separating the plurality of the first electrodes. The pixel defining frame is configured to define a plurality of sub-pixel regions; forming an organic functional layer on the pixel defining frame and the sub-pixel region. The method includes forming a hollow structure at a position corresponding to the pixel defining frame in the organic functional layer. The hollow structure forms an insulation between; and forming a second electrode on the organic functional layer.

In an exemplary arrangement of the present disclosure, the groove-shaped structure surrounds the sub-pixel region.

In an exemplary arrangement of the present disclosure, the forming the hollow structure includes: forming the hollow structure by a laser ablation process.

In an exemplary arrangement of the present disclosure, the hollow structure surrounds the sub-pixel region.

In an exemplary arrangement of the present disclosure, the organic functional layer includes a plurality of laminated layers including a light emitting layer and at least one of a hole injection layer, a hole transport layer, an electron transport layer, and an electron injection layer; the hole injection layer is disposed adjacent to the first electrode, and the electron injection layer is disposed adjacent to the second electrode.

In an exemplary arrangement of the present disclosure, the forming a hollow structure at a position corresponding to the pixel defining frame in the organic functional layer includes: after forming all layers of the organic functional layer, forming groove-shaped structures along a first direction and a second direction respectively at a position corresponding to the pixel defining frame in all layers of the organic functional layer.

In an exemplary arrangement of the present disclosure, the forming a hollow structure at a position corresponding to the pixel defining frame in the organic functional layer includes: forming a first portion of the organic functional layer, forming groove-shaped structures along a first direction and a second direction respectively at a position corresponding to the pixel defining frame in the first portion of the organic functional layer; and forming a second portion of the organic functional layer on the first portion of the organic functional layer on which the groove-shaped structure is formed.

In an exemplary arrangement of the present disclosure, the first electrode is an anode layer and the second electrode is a cathode layer.

According to one aspect, the present disclosure provides a display apparatus, including the OLED display panel described above.

It should be noted that, the above general description and following detailed description are illustrative and explanatory only but not restrictive to the present disclosure.

This section provides a summary of various implementations or examples of the technology described in the disclosure, and is not a comprehensive disclosure of the full scope or all features of the disclosed technology.

BRIEF DESCRIPTION OF THE DRAWINGS

The accompanying drawings herein are incorporated in and constitute a part of this specification, illustrate arrangements consistent with the present disclosure, and together with the description serve to explain the principles of the present disclosure. Obviously, the drawings in the following description are merely some arrangements of the present disclosure, and those skilled in the art can also obtain other drawings based on these drawings without any creative labor.

DETAILED DESCRIPTION

Figure 1:
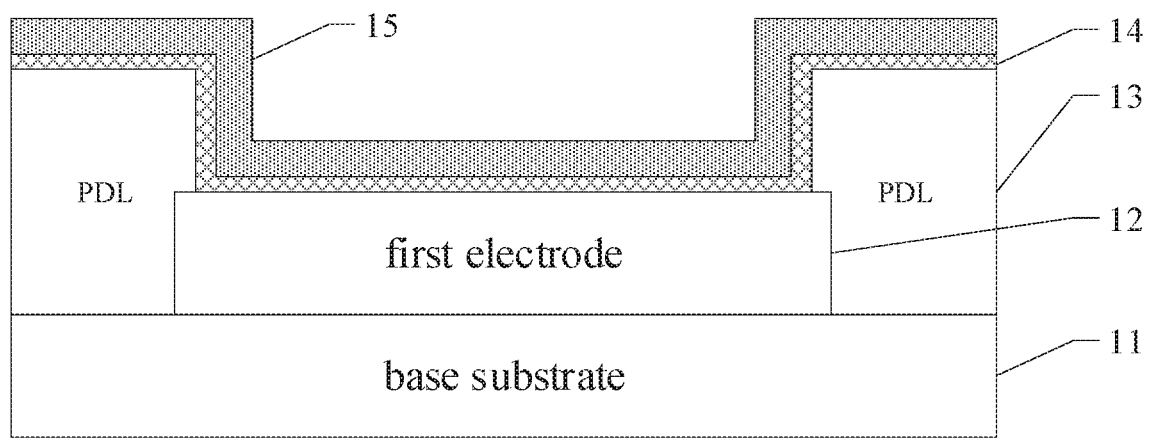
FIG. 1 is a schematic structural view showing a conventional OLED panel.

Example arrangements will now be described more fully with reference to the accompanying drawings. However, example arrangements can be implemented in various forms and should not be construed as limited to the examples set forth herein; rather, these arrangements are provided so that the present disclosure will be more comprehensive and complete, and will fully convey the concept of the example arrangements to those skilled in the art. The features, structures, or characteristics described may be combined in any suitable manner in one or more arrangements. In the following description, numerous specific details are provided to provide a thorough understanding of the arrangements of the present disclosure. However, one skilled in the art will appreciate that one or more of the specific details may be omitted while implementing the technical solutions of the present disclosure, or other methods, components, apparatuses, steps, etc. may be employed. In other instances, well-known technical solutions are not shown or described in detail to avoid distracting to make aspects of the present disclosure obscured.

Although relative terms such as "upper" and "lower" are used in the specification to describe the relative relationship of one component to another component of the icon, these terms are used in this specification for convenience only, for example, according to the direction of the example described in the accompanying drawings. It will be understood that if the apparatus illustrated in the drawings is flipped upside down, the component described "above" will become the component "below". When a structure is "on" other structures, it is possible that a structure is integrally formed on other structures, or that a structure is "directly" disposed on other structures, or that a structure is "indirectly" disposed on other structures through another structure.

The terms "a", "an", "the" and "said" are used to indicate the presence of one or more elements/components/parts, etc.; the terms "including" and "having" are used to indicate the inclusive meaning and indicates that there may be additional elements/components/etc., in addition to the listed elements/components/etc.; the terms "first" and "second" etc. are used only as marks, not to limit the number of objects.

Figure 2:
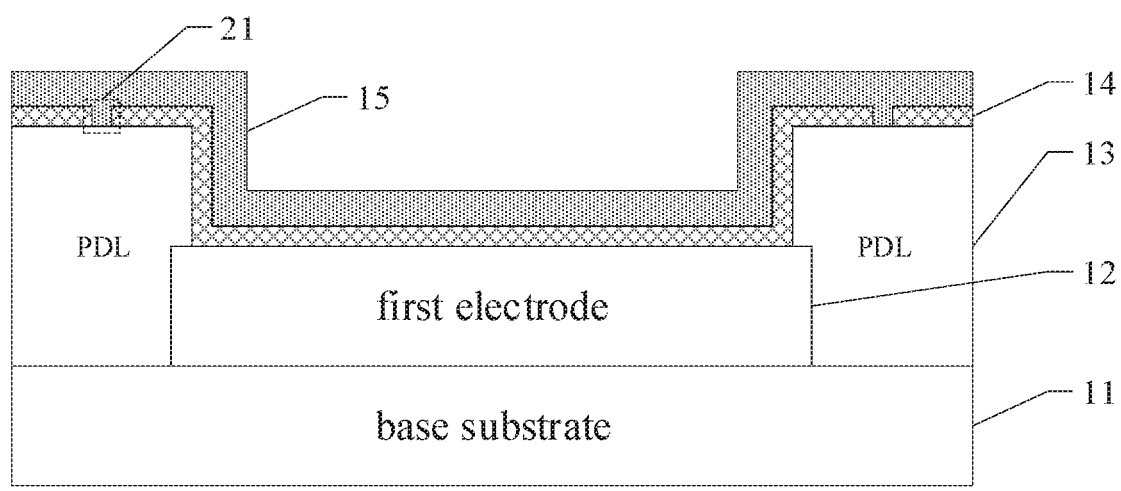
FIG. 2 is a schematic structural view showing an OLED panel in an exemplary arrangement of the present disclosure.
Figure 3:
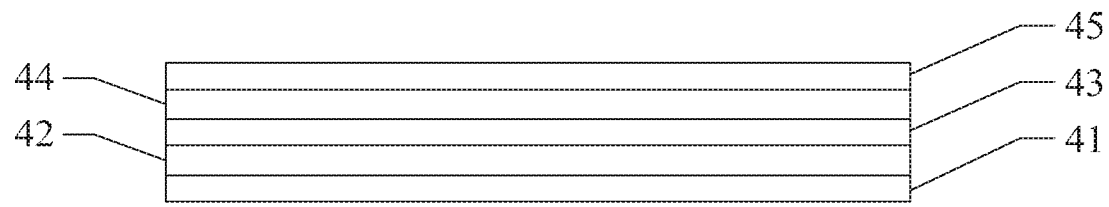
FIG. 3 is a schematic structural view showing an organic functional layer in an exemplary arrangement of the present disclosure.

Referring to FIG. 1, the conventional OLED display panel structure generally includes a first electrode 12, a pixel defining frame (PDL) 13, an organic functional layer 14, and a second electrode 15 which are stacked on the base substrate 11. The organic functional layer 14 of adjacent sub-pixels is prone to lateral transmission of carriers, resulting in lateral crosstalk phenomenon between pixels. In the exemplary arrangement, an OLED display panel is firstly provided, which can improve the lateral crosstalk problem of the organic functional layer. Referring to FIG. 2, the OLED display panel may include: a base substrate 11, a first electrode 12, a pixel defining frame 13, an organic functional layer 14, and a second electrode 15.

In the arrangement, the first electrode 12 is located on the base substrate 11. The pixel defining frame 13 is located on the first electrode 12, and the pixel defining frame 13 is used to define a plurality of sub-pixel regions. The multilayer organic functional layer 14 is located on each of the sub-pixel regions and the pixel defining frame 13. At least one layer of the organic functional layer 14 has a hollow structure at a position corresponding to the pixel defining frame 13. The hollow structure partitions an organic functional layer 14 having conductivity in two adjacent sub-pixel regions. In the OLED display panel provided by the arrangement, at least one layer of the organic functional layer has a hollow structure at a position corresponding to the pixel defining frame. In this way, the organic functional layer having conductivity in the adjacent sub-pixel regions is disconnected by the hollow structure. The lateral transfer of carriers of the organic functional layer between adjacent sub-pixel regions can be reduced or blocked, thus reducing the lateral leakage of the organic functional layer and reducing the occurrence of crosstalk phenomenon, and thus ensuring the display effect of the display panel.

In an exemplary arrangement, the hollow structure may be, for example, a groove-shaped structure 21, and the groove-shaped structure 21 is disposed around the sub-pixel region. However, it is to be noted that at the position of the sub-pixel region of the outermost boundary, the groove-shaped structure 21 does not have to be disposed around the sub-pixel region, as long as it can achieve the reducing or blocking effects. The second electrode 15 is located on the organic functional layer 14.

In an exemplary arrangement, the hollow structure includes a first groove-shaped structure extending along a first direction and a second groove-shaped structure extending along a second direction.

In an exemplary arrangement, the hollow structure includes a plurality of the first groove-shaped structures and a plurality of the second groove-shaped structures. At least one row of sub-pixels is interposed between adjacent ones of the first groove-shaped structures, and at least one column of sub-pixels is interposed between adjacent ones of the second groove-shaped structures.

It should be noted that when the hollow structure is the groove-shaped structure 21 in the above arrangement, the description of the groove-shaped structure 21 surrounding the sub-pixel regions may be made with respect to one or more sub-pixels. The description of "the hollow structure includes a plurality of the first groove-shaped structures and a plurality of the second groove-shaped structures. At least one row of sub-pixels is interposed between adjacent ones of the first groove-shaped structures, and at least one column of sub-pixels is interposed between adjacent ones of the second groove-shaped structures" may be made from the perspective of the entire organic functional layer. That is, at least one layer of the entire organic functional layer has a first groove-shaped structure extending in the first direction and a second groove-shaped structure extending in the second direction at a position corresponding to the pixel defining frame. The details are illustrated in FIG. 7.

Figure 7:
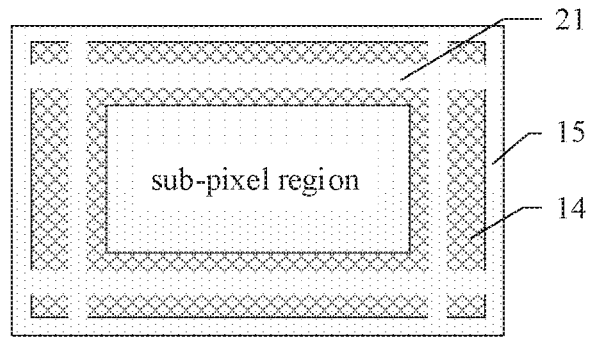
FIG. 7 is a schematic plan view showing an organic functional layer formed with a groove-shaped structure in an exemplary arrangement of the present disclosure.

As shown in FIG. 7, by disposing a groove-shaped structure 21 surrounding the sub-pixel region at a position of the multi-layer organic functional layer 14 corresponding to the pixel-defining frame, the OLED display panel provided by the present disclosure avoids the lateral transmission of carriers of the organic functional layer 14 between adjacent sub-pixels, which in turn avoids lateral conduction between the hierarchical mechanisms having conductive properties in the multilayer organic functional layers of adjacent sub-pixels, thus avoiding the occurrence of crosstalk phenomenon, and thus ensuring the display effect of the display panel.

In the OLED display panel provided by the example arrangement, the base substrate 11 may adopt a glass substrate or a flexible substrate such as a PI (Polyimide) substrate.

The first electrode 12 may be an anode layer for providing holes. The first electrode 12 may be a transparent electrode layer. The transparent first electrode layer may be formed by using a transparent conductive material having a relatively large work function, such as Indium Tin Oxide (ITO), zinc tin oxide (ZTO), indium zinc oxide (IZO), zinc oxide, gallium indium zinc oxide (GIZO), and the like. In addition, the first electrode layer may also be a composite layer including a transparent conductive material layer and a metal layer, such as an indium tin oxide/silver/indium tin oxide composite layer, that is, an ITO/Ag/ITO composite layer. In other exemplary arrangements, the first electrode 12 may also be made of an opaque material, such as ITO/Ag/ITO or AlNd or the like.

The pixel defining frame 13 is formed on a base substrate on which the first electrode layer is formed. The pixel defining material layer is patterned by a patterning process, to form a pixel defining frame including a plurality of openings and pixel spacers. Positions of the sub-pixels are defined by the pixel defining frame. In the arrangement, each of the openings corresponds to each of the plurality of pixel regions, and the pixel spacers encircles to form the plurality of openings. The patterning process of the present exemplary arrangement may include at least processes such as exposure, development, etching (wet etching or dry etching). The material of the pixel defining material layer may be prepared by using an organic or inorganic insulating material.

In the present exemplary arrangement, as described with reference to FIGS. 3-6, the above-described multilayer organic functional layer 14 may include part or all of a hole injection layer 41, a hole transport layer 42, a light emitting layer 43, an electron transport layer 44, and an electron injection layer 45 that are laminated. For example, in a part of the OLED display panel, the electron transport layer 44 and the electron injection layer 45 may be omitted. In the arrangement, the hole injection layer 41 may be disposed adjacent to the first electrode 12, and the electron injection layer 45 may be disposed adjacent to the second electrode 15.

In the arrangement, the hole injection layer (HIL) 41 can facilitate hole injection from the first electrode layer to the hole transport layer (HTL) 42. The hole injection layer 41 may be formed by using a hole injecting material, such as copper phthalocyanine (CuPc), poly(3,4)-ethylene dioxythiophene (PEDOT), polyaniline (PANT), or a mixture of these materials. The HIL can be obtained by a vacuum evaporation process, a thermal evaporation process, a slit coating process, a spin coating process, a printing process, and the like.

The hole transport layer 42 may be formed by utilizing a hole transporting material, such as 4,4'-bis[N-(1-naphthyl)-N-phenylamino]biphenyl (NPB), N,N'-diphenyl-N,N'-bis(3-methylphenyl)-1,1'-biphenyl-4,4-diamine (TPD), N,N'-di-1-naphthyl-N,N'-biphenyl-1,1'-diphenyl-4,4'-diamine (NPD), N-phenylcarbazole, polyvinylcarbazole or the like or a mixture of these materials. The HTL can be obtained by a vacuum evaporation process, a thermal evaporation process, a slit coating process, a spin coating process, a printing process, and the like.

The light emitting layer (EML) 43 may include a red light emitting layer (R-EML), a green light emitting layer (G-EML), and a blue light emitting layer (B-EML). The light emitting layer 43 may be formed by using a suitable light emitting material for generating red light, green light, or blue light according to a light emitting mechanism of the light emitting layer 43, such as a fluorescence mechanism or a phosphorescence mechanism. The light emitting layer 43 can be obtained by a printing process including an inkjet, rotary or nozzle printing process, a transfer process by heat or laser using a body substrate.

The electron transport layer (ETL) 44 may be formed by utilizing, for example, tris(8-hydroxyquinoline)aluminum (III) (Alq3), 2-4-(biphenylene)-5-4-tert-butylphenyl-1,3,4-oxadiazole (PBD), bis(2-methyl-8-hydroxyquinoline)-4-phenylphenolate-aluminum (BAlq), 2,9-dimethyl-4,7-diphenyl-1,10-phenanthroline (BCP). The above compounds may be used singly or in the form of a mixture thereof.

The organic functional layer may also include an electron injection layer (EIL) 45 on the electron transport layer 44. The electron injection layer 45 can be formed using an alkali metal, an alkaline earth metal, a fluoride of these metals, an oxide of these metals, or the like. The above materials may be used singly or in the form of a mixture thereof.

Figure 4:
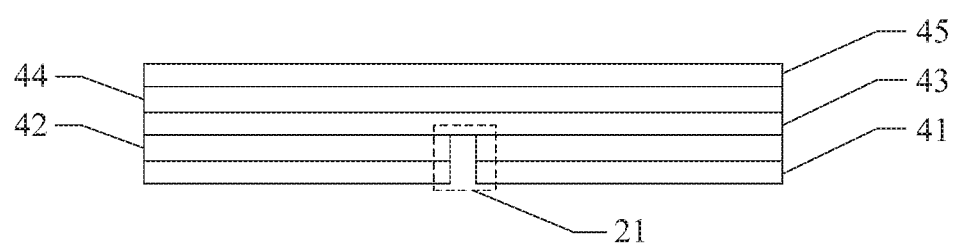
FIG. 4 is a schematic structural view showing a multilayer organic functional layer formed with a groove-shaped structure in an exemplary arrangement of the present disclosure.
Figure 5:
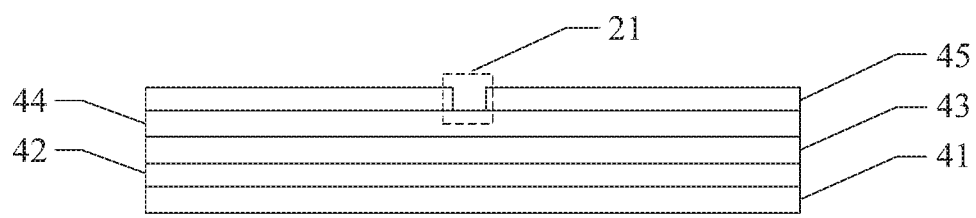
FIG. 5 is another schematic structural view showing a multilayer organic functional layer formed with a groove-shaped structure in an exemplary arrangement of the present disclosure.
Figure 6:
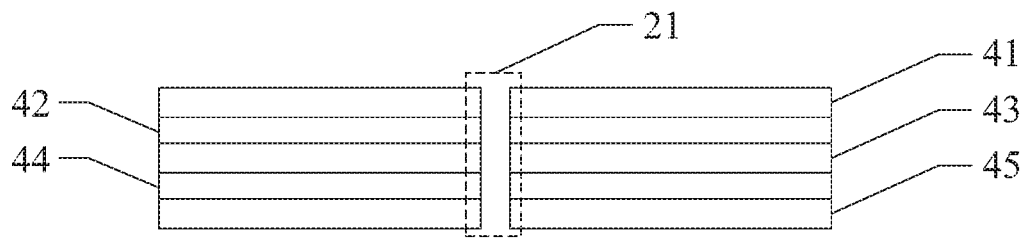
FIG. 6 is yet another schematic structural view showing a multilayer organic functional layer formed with a groove-shaped structure in an exemplary arrangement of the present disclosure.

Based on the above, in the present exemplary arrangement, referring to FIGS. 4-6, the groove-shaped structure 21 may penetrate through a part of the organic functional layer or all of the multilayer organic functional layer 14. As shown in FIG. 7, the groove-shaped structure 21 is disposed above the pixel defining frame 13 to surround the peripheral sub-pixel region.

For example, the groove-shaped structure 21 may be formed on the hole injection layer 41 as needed. Alternatively, the groove-shaped structure 21 may be formed on both the hole injection layer 41 and the hole transport layer 42 and other adjacent multilayer organic functional layers. Alternatively, the groove-shaped structure 21 may be formed after all of the organic functional layers are formed, such that the groove-shaped structure 21 penetrates through one layer or several layers or all layers of the multilayer organic functional layer. For example, the multilayer organic functional layer 14 may include a hole injection layer 41, a hole transport layer 42 and a light emitting layer 43 which are laminated, and since the light emitting layer 43 has no conductivity, the groove-shaped structure only needs to penetrate through the hole injection layer 41 and the hole transport layer 42, and the light emitting layer 43 may be selectively penetrated. The multilayer organic functional layer 14 in adjacent sub-pixel regions in which the lateral conduction phenomenon exists is laterally disconnected by the groove-shaped structure 21, thus reducing the occurrence of crosstalk phenomenon.

In the present exemplary arrangement, the second electrode 15 described above may be a cathode layer. The second electrode layer may be formed using a transparent conductive material or a metal according to a type thereof, such as a transparent electrode or a reflective electrode. The transparent conductive material may include ITO, ZTO, IZO, ZnOx, SnOx, GIZO, AZO, or the like. The metal may include, for example, Ag, Al, Pt, Au, Cr, W, Mo, Ti, Pd, etc. or an alloy thereof. The second electrode layer may be obtained by a sputtering process, a chemical vapor deposition (CVD) process, an atomic layer deposition (ALD) process, a vacuum deposition process, a printing process, or the like.

Figure 8:
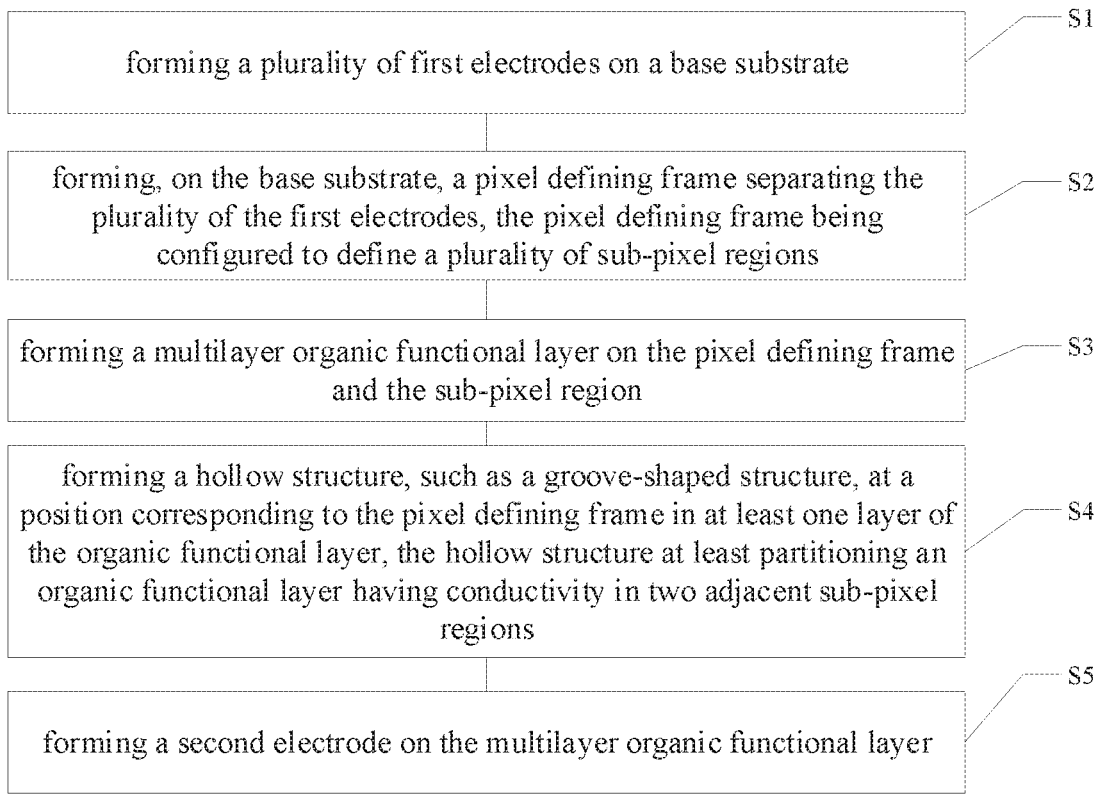
FIG. 8 is a schematic view showing a method of manufacturing an OLED panel in an exemplary arrangement of the present disclosure.

Further, as shown in FIG. 8, the exemplary arrangement further provides a method of manufacturing an OLED display panel, including following steps:

step S1, forming a plurality of first electrodes 12 on a base substrate 11;

step S2, forming, on the base substrate 11, a pixel defining frame 13 separating the plurality of the first electrodes 12, the pixel defining frame 13 being configured to define a plurality of sub-pixel regions;

step S3, forming a multilayer organic functional layer 14 on the pixel defining frame 13 and the sub-pixel region;

step S4, forming a hollow structure, for example, a groove-shaped structure 21, at a position corresponding to the pixel defining frame 13 in at least one layer of the organic functional layer 14, the hollow structure at least partitioning an organic functional layer having conductivity in two adjacent sub-pixel regions; and step S5, forming a second electrode 15 on the multilayer organic functional layer 14.

In the method provided by the present disclosure, a groove-shaped structure 21 surrounding the sub-pixels may be formed for the organic functional layer above the pixel defining frame 13 by a laser ablation process, so that an organic functional layer having conductivity between adjacent sub-pixels is disconnected, which avoids the lateral transfer of carriers of the organic functional layer between pixels, thus effectively avoiding the occurrence of lateral crosstalk phenomenon. In the process of forming the groove-shaped structure by laser ablation described above, the power and duration of the laser ablation may be correspondingly set according to the organic functional layers to be penetrated, and the materials and thicknesses of the organic functional layer to be penetrated, etc. This is not particularly limited in the exemplary arrangement.

In the present exemplary arrangement, the first electrode 12 may be an anode layer, and the second electrode 15 may be a cathode layer.

Based on the above, in other exemplary arrangements of the present disclosure, as illustrated with reference to FIGS. 3-6, the multilayer organic functional layer 14 may include part or all of a hole injection layer 41, a hole transport layer 42, a light emitting layer 43, an electron transport layer 44, and an electron injection layer 45 that are laminated; the hole injection layer 41 is disposed adjacent to the first electrode 12, and the electron injection layer 45 is disposed adjacent to the second electrode 15.

The organic functional layer can be prepared by a thermal evaporation method or a wet method (for example, printing or spin coating, etc.). After a part or all of the hierarchical structure of the multilayer organic functional layer is prepared, one or more layers of the organic functional layer above the pixel defining frame 13 may be disconnected by a laser ablation process, such that the lateral conductivity of the layer of the organic functional layer becomes a lateral disconnection.

In the present exemplary arrangement, as shown in FIG. 2, the forming a hollow structure, such as a groove-shaped structure 21, at a position corresponding to the pixel defining frame 13 in at least one layer of the organic functional layer 14, the hollow structure at least partitioning an organic functional layer having conductivity in two adjacent sub-pixel regions may include: after forming an entire hierarchical structure of the multilayer organic functional layer 14, forming groove-shaped structures 21 along a first direction and a second direction respectively at a position corresponding to the pixel defining frame 13 in the entire hierarchical structure of the multilayer organic functional layer 14. In the arrangement, the first direction and the second direction are respectively a row direction and a column direction.

In other example arrangements of the present disclosure, the forming a hollow structure, such as a groove-shaped structure 21, at a position corresponding to the pixel defining frame 13 in at least one layer of the organic functional layer 14, the hollow structure at least partitioning an organic functional layer having conductivity in two adjacent sub-pixel regions may include: may further include: forming a first portion of the organic functional layer, forming groove-shaped structures 21 along a first direction and a second direction respectively at a position corresponding to the pixel defining frame 13 in the first portion of the organic functional layer; and forming a second portion of the organic functional layer on the first portion of the organic functional layer on which the groove-shaped structure 21 is formed.

For example, referring to FIG. 4, when the organic functional layer needed to be disconnected is the hole injection layer 41 and the hole transport layer 42, the hole injection layer 41 and the hole transport layer 42 are sequentially formed, a groove-shaped structure 21 is formed by a laser ablation process on the hole injection layer 41 and the hole transport layer 42 which have been formed, thus disconnecting the hole injection layer 41 and the hole transport layer 42 of the adjacent sub-pixel regions. However, it is to be noted that, in other exemplary arrangements of the present disclosure, the groove-shaped structure 21 may also be formed by other manners, such as a photolithography process, which also falls within the protection scope of the present disclosure. Then, a light emitting layer 43, an electron transport layer 44, and an electron injection layer 45 are sequentially formed on the hole injection layer 41 and the hole transport layer 42 on which the groove-shaped structure 21 has been formed, to form a complete organic functional layer 14. The multilayer organic functional layer 14 formed at this time is formed with a groove-shaped structure 21 on the hierarchical structure of the hole injection layer 41 and the hole transport layer 42, thus avoiding the lateral crosstalk phenomenon. Similarly, the groove-shaped structure 21 may also be formed on the hole injection layer 41 alone by ablation or photolithography, or the groove-shaped structure 21 may be formed on the hole injection layer 41, the hole transport layer 42 and the light emitting layer 43; or the groove-shaped structure 21 may be formed on the hole injection layer 41, the hole transport layer 42, the light emitting layer 43, and the electron transport layer 44.

Referring to FIG. 5, when the organic functional layer needing to be disconnected is the electron injection layer 45, the hole injection layer 41, the hole transport layer 42, the light emitting layer 43, and the electron transport layer 44 may be sequentially formed on the first electrode layer. Then, an electron injection layer 45 with the groove-shaped structure 21 formed thereon is laid on the electron transport layer 44. Alternatively, referring to FIG. 6, after all the hierarchical mechanisms are sequentially formed, the multilayer organic functional layer 14 is subjected to laser ablation, and all layers of all the organic functional layer are disconnected to form a groove-shaped structure.

It is to be noted that the above-described drawings are merely indicative description of the processes included in the method according to the exemplary arrangements of the present disclosure, and are not intended to be limiting. It is easy to understand that the processing shown in the above figures does not indicate or limit the chronological order of these processes. In addition, it is also easy to understand that these processes may be performed synchronously or asynchronously, for example, in a plurality of modules.

Further, an arrangement of the present example further provides an OLED display apparatus including the above OLED display panel.

In the exemplary arrangement, the display apparatus may include any product or component having a display function, such as a mobile phone, a tablet computer, a television, a notebook computer, a digital photo frame, a navigator, and the like.

In the OLED display panel provided by the present disclosure, by providing a groove-shaped structure in the organic functional layer on the pixel defining frame to disconnect the organic functional layer of adjacent sub-pixels, the crosstalk problem caused by lateral leakage may be effectively avoided, thus ensuring a display effect of the display panel.

Those skilled in the art will readily recognize other arrangements of the disclosure after considering the specification and practicing the disclosure disclosed herein. This application is intended to cover any variations, uses, or adaptations of the present disclosure which follow the general principles of the present disclosure and include any common knowledge or conventional technological means in this technical field not disclosed by the present disclosure. The specification and arrangements are to be regarded as illustrative only, with true scope and spirit of the disclosure indicated by the claims.

What is claimed is:

1. A method of manufacturing an OLED display panel, comprising:
    forming a plurality of first electrodes on a base substrate;
    forming, on the base substrate, a pixel defining frame separating the plurality of the first electrodes, the pixel defining frame being configured to define a plurality of sub-pixel regions;
    forming an organic functional layer on the pixel defining frame and the plurality of sub-pixel regions;
    forming a hollow structure at a position corresponding to the pixel defining frame in the organic functional layer, wherein the hollow structure forms an insulation between two adjacent one of the plurality of sub-pixel regions in the organic functional layer; and
    forming a second electrode on the organic functional layer,
    wherein the organic functional layer comprises a plurality of laminated layers comprising a light emitting layer and at least one of a hole injection layer, a hole transport layer, an electron transport layer, and an electron injection layer;
    the hole injection layer is disposed adjacent to the first electrode, and the electron injection layer is disposed adjacent to the second electrode, and
    wherein the forming the hollow structure at the position corresponding to the pixel defining frame in the organic functional layer comprises:
        forming a first portion of the organic functional layer, forming groove-shaped structures along a first direction and a second direction respectively at the position corresponding to the pixel defining frame in the first portion of the organic functional layer; and
        forming a second portion of the organic functional layer on the first portion of the organic functional layer on which the groove-shaped structure is formed.

2. The method of manufacturing an OLED display panel according to claim 1, wherein the forming the hollow structure comprises:
    forming the hollow structure by a laser ablation process.

3. The method of manufacturing an OLED display panel according to claim 1, wherein the hollow structure surrounds plurality of the sub-pixel regions.

* * * * *